United States Patent [19]

Taylor

[11] 4,089,927
[45] May 16, 1978

[54] STRAIN SENSOR EMPLOYING BI LAYER PIEZOELECTRIC POLYMER

[75] Inventor: Allen L. Taylor, Woodbury, Minn.

[73] Assignee: Minnesota Mining and Manufacturing Company, St. Paul, Minn.

[21] Appl. No.: 737,215

[22] Filed: Nov. 1, 1976

Related U.S. Application Data

[60] Division of Ser. No. 616,906, Sep. 26, 1975, Pat. No. 4,023,054, which is a continuation of Ser. No. 467,016, May 6, 1974, abandoned.

[51] Int. Cl.² .............................................. H01L 41/10
[52] U.S. Cl. ....................................... 310/331; 310/800
[58] Field of Search .................... 310/8.3, 8.5, 8.6, 8, 310/9, 4, 311, 328, 338, 800; 73/88.5 R, 88.5 SD, DIG. 4, 398 R; 204/2, 194

[56] References Cited

U.S. PATENT DOCUMENTS

| | | | |
|---|---|---|---|
| 2,816,236 | 12/1957 | Rosen | 310/311 X |
| 3,543,083 | 11/1970 | Sylvander | 310/311 X |
| 3,647,665 | 3/1972 | Lester | 310/8 X |
| 3,798,474 | 3/1974 | Cassand et al. | 310/8.6 X |
| 3,805,601 | 4/1974 | Jeffers | 310/8 X |
| 3,816,774 | 6/1974 | Ohnuki et al. | 310/8.6 |
| 3,818,426 | 6/1974 | Bonnet et al. | 310/311 X |
| 3,903,733 | 9/1975 | Murayama | 310/800 X |

*Primary Examiner*—Mark O. Budd
*Attorney, Agent, or Firm*—Cruzan Alexander; Donald M. Sell; Walter N. Kirn

[57] ABSTRACT

A strain sensor and a method for producing a remanent electrostatic image of the strain gradient existing on the surface of an object are disclosed. The sensor includes a layer of poled, piezoelectric material that is employed as a medium on which the strain gradient image is electrostatically formed. The piezoelectric layer is coated on one side with an electrically conductive layer, and the sensor is adapted to be positioned with the conductive layer in surface-to-surface contact with the object. Thereupon, a stress is applied to the object to place it in a condition of strain whereby the object is dimensionally changed or deformed. Both layers of the sensor are highly compliant to permit the sensor to be bent from its normal configuration to conform to the surface stress of the object without significantly affecting the strain of the object. Next, the surfaces of the piezoelectric layer are neutralized and the stress on the sensor is then relaxed. As the object returns to its normal configuration, an electrostatic image representative of the strain gradient caused by the stress forms on the uncoated surface of the piezoelectric layer.

4 Claims, 5 Drawing Figures

U.S. Patent     May 16, 1978     4,089,927
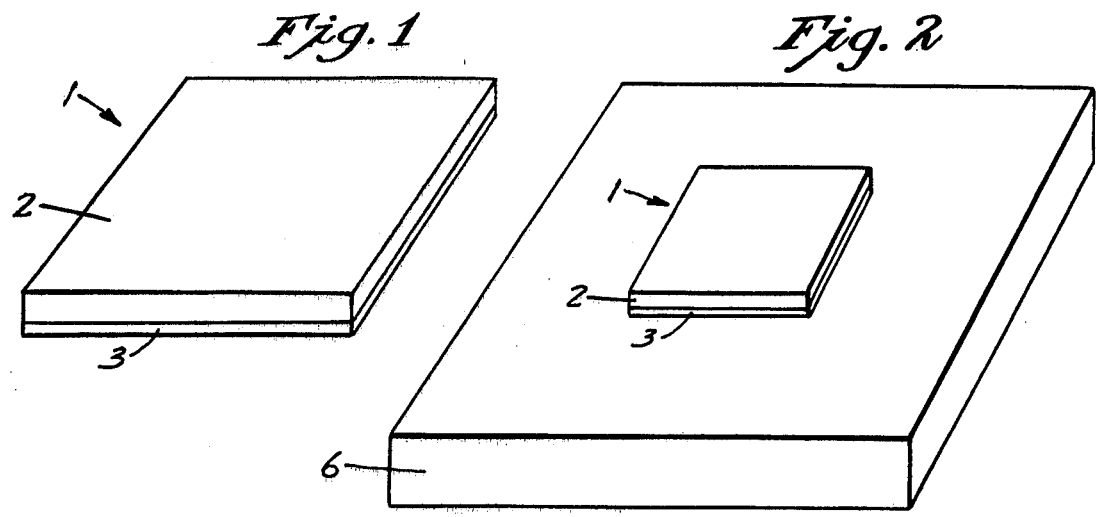
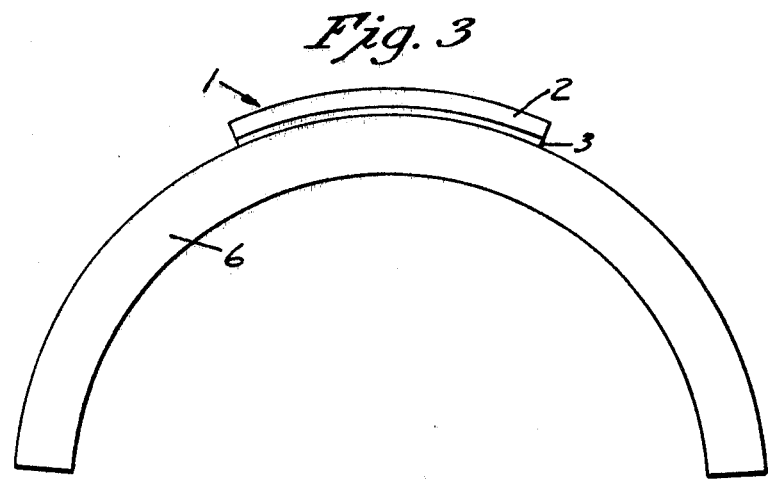
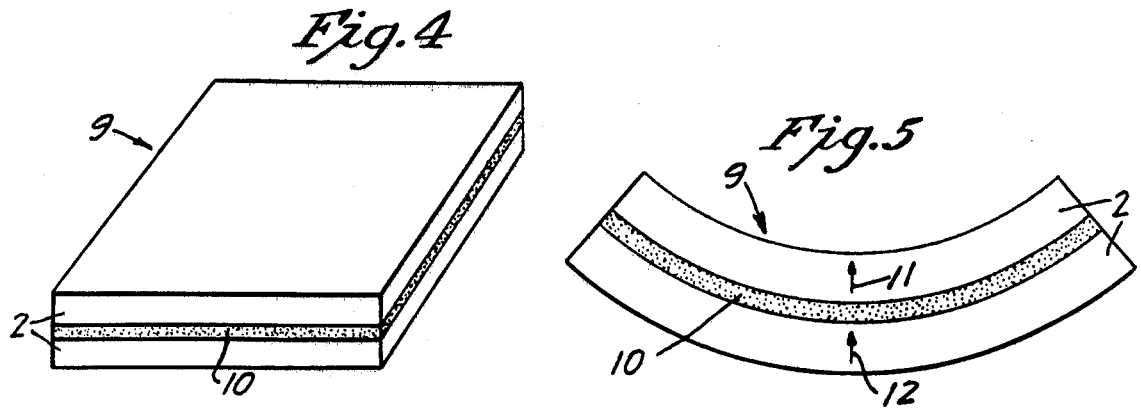

STRAIN SENSOR EMPLOYING BI LAYER PIEZOELECTRIC POLYMER

This is a divisional of Application Ser. No. 616,906, filed Sept. 26, 1975, now U.S. Pat. No. 4,023,054, which in turn was a continuation of Ser. No. 467,016, filed May 6, 1974, now abandoned.

BACKGROUND OF THE INVENTION

1. Field of the Invention

The present invention relates in general to a strain sensor and a method for providing a profile of the strain gradient of an object, and more specifically resides in the utilization of a poled, piezoelectric layer as a strain sensing medium of such a sensor.

2. Description of the Prior Art

A number of types of strain sensors are known in the art and moreover, the use of piezoelectric material in strain sensors is not new as evidenced by U.S. Pat. to Ayers et al, No. 3,750,127. The Ayers et al patent discloses a coaxially constructed strain sensor that has an inner conductor, an outer conductor substantially circumscribing the inner conductor, and a piezoelectric strain sensing medium interposed between and in firm contact with both conductors. An electronic sensing circuit is connected to the piezoelectric sensing medium to sense electrical charges generated by the medium as a result of subjecting the sensor to mechanical deformation or strain.

Although the Ayers et al sensor apparently provides a satisfactory means for detecting and indicating levels of strain, such sensor does not provide a remanent image of the surface strain gradient of an object.

SUMMARY OF THE INVENTION

The present invention provides a sensor for electrostatically producing a two-dimensional surface profile of the strain to which an object is subjected; such sensor includes a normally flat layer of poled, piezoelectric material and an electrically conductive layer coated on one side of the piezoelectric layer. The sensor is adapted to be attached in surface-to-surface contact with the exterior surface of an object, and the sensor is high compliant so that when a stress is applied to the object, the sensor will not significantly affect the strain of the object produced by the stress. Instead, the sensor will readily conform with changes in strain of the object. The piezoelectric layer produces electrostatic charges of opposite polarities on its planar surfaces when conforming to the strain of the object, and such charges on the uncoated surface of the piezoelectric layer are representative of the surface strain gradient of the object.

In a preferred embodiment the piezoelectric layer of the sensor is a single thin sheet of uniformly poled, polymer piezoelectric material to form a sensor that is relatively thin with respect to the object on which it is placed. In a modified embodiment the piezoelectric layer includes two sheets of piezoelectric material that are adhesively joined together in surface-to-surface contact. Such construction provides an embodiment that is not responsive to spurious piezoelectrically produced charges produced by bending the sensor when it is not attached to an object.

The present invention further includes a method for employing the above described strain sensor to provide a remanent image of the strain gradient of an object. The first step of the disclosed method is to attach the sensor on the object so that the sensor conforms to the surface configuration thereof. The object is then subjected to a stress and as a result, an electrostatic strain profile of the object results on the surface of the sensor piezoelectric layer. Thereupon, the coated surface of the piezoelectric layer is grounded and the uncoated surface neutralized to remove the piezoelectrically produced electrostatic charges therefrom. The stress on the object is then relaxed whereupon a second electrostatic image, opposite to the first image is formed on the uncoated piezoelectric surface. Next, the uncoated surface of the piezoelectric layer is powdered with an electrostatic toner powder to produce a visible remanent image of the strain gradient of the object. Thus, the present invention provides a relatively simplistic and inexpensive means and method for producing a remanent strain profile of an object through piezoelectrically produced electrostatic charges.

The foregoing and other advantages of the present invention will appear from the following description. In the description reference is made to the accompanying drawings, which form a part hereof, and in which there is shown by way of illustration, and not of limitation, specific forms in which the invention may be embodied. Such embodiments do not represent the full scope of the invention, but rather the invention may be employed in a wide variety of embodiments, and reference is made to the claims herein for interpreting the breadth of the invention.

BRIEF DESCRIPTION OF THE DRAWINGS

FIG. 1 is a perspective view of a strain sensor of the present invention and includes a piezoelectric sheet that is coated on its lower surface with a conductive layer;

FIG. 2 is a perspective view of the sensor of FIG. 1 attached to a portion of the exterior surface of a rectangular plate;

FIG. 3 is a side view of the sensor and plate of FIG. 2 shown in a bent condition;

FIG. 4 is a perspective view of a piezoelectric layer that may be substituted for the piezoelectric sheet of the sensor in FIG. 1; and FIG. 5 is a side view of the layer of FIG. 4 shown in a bent condition.

DESCRIPTION OF THE PREFERRED EMBODIMENTS

A preferred embodiment of the two-dimensional, strain sensor of the present invention is shown at 1 in FIG. 1. The sensor 1 is formed of a relatively thin sheet 2 of uniformly poled, piezoelectric material that is coated on one side with a thin, electrically conductive layer 3. The sheet 2 is preferably formed from such material as polyvinylidene fluoride, or other such polymeric material having piezoelectric properties. Poled, piezoelectric materials exhibit the unique characteristic of developing electrostatic charges on their planar surfaces when subjected to certain mechanical deformation or strain, with the charges developed on one surface opposite in polarity to those developed on the other surface.

The sensor 1 is adapted to be utilized by fastening the conductive layer 3 in temporary surface-to-surface contact with the planar surface of an object that is to be strained. For example, the sensor 1 is shown in FIG. 2 attached to a portion of the exterior surface of a flat rectangular plate 6. The sensor 1 may be held on the plate 6 with an adhesive or other such temporary attachment means. Once the sensor 1 is firmly attached to the plate 6, a stress is applied to the plate 6 to place the plate 6 in a condition of strain in which the plate 6 is dimensionally changed or deformed.

Due to the surface-to-surface connection between the conductive layer 3 of the sensor 1 and the exterior surface of the plate 6, the piezoelectric sheet 2 will conform to dimensional changes or deformation in the surface configuration of that portion of the plate 6 that the sensor 1 overlies. The elastic coefficient of the sensor 1 is chosen so that the attachment of the sensor 1 to the plate 6 will have no significant affect on dimensional changes or deformation in the plate 6. Instead, the sensor 1 will conform to the surface configuration of the plate 6 and, thus, will be strained just as the plate 6 is strained. Such strain of the sensor 1 produces electrostatic charges of the opposite polarity on the coated and uncoated surfaces of the piezoelectric sheet 2 due to such strain. For example, bending of the plate 6 produces an extension of the surfaces of the sheet 2 and results in the accumulation of electrostatic charges of opposite polarity on the coated and uncoated surfaces of the sheet 2. Such electrostatic charges are produced in direct proportion of the severity of the bending of the plate 6. Thus, the strain profile of the plate 6 is evidenced by a variation in the build-up of electrostatic charges on the surface of the sheet 2. Because the sheet 2 is electrically nonconductive, the accumulated charges on the uncoated surface of the sheet 2 form an electrostatic latent image that accurately reflects the strain gradient of the portion of the plate 6 in contact with the sensor 1.

If desired, the latent image on the piezoelectric layer 3 may be developed without relaxing the stress on the plate 6. Development at this time may be performed by electrically grounding the conductive layer 3 to neutralize the coated surface of the sheet 2, and then detecting the electrostatic charge pattern on the uncoated surface of the sheet 2 through the use of an electrostatic voltmeter that is connected to a two-dimensional visual read out such as an X-Y recorder, or by the employment of conventional toner powder techniques for developing electrostatic images.

In most cases, however, it may be difficult or inconvenient to develop the latent image on the piezoelectric sensor 1 while the plate 6 remains in a strained condition. However, relaxing of the stress on the plate 6 at this time presents a problem because the strain profile image is not permanent and as soon as the stress on the plate 6 is removed, the plate 6 will return to its normal configuration, causing the strain profile image to disappear. It is therefore desirable to neutralize both surfaces of the sheet 2 to remove the electrostatic charges thereon before relaxing the stress on the plate 6.

The electrostatic charges on the surface of the layer 2 may be neutralized by electrically grounding the layer 3, and the charges on the uncoated surface of the sheet 2 may be removed by sweeping such surface with a grounded Pluton brush or by the use of a grounded alpha particle static eliminator. Neutralizing the surfaces of the sheet 2 in this manner places the sheet 2 in the same electrostatic condition it was in before the plate 6 was placed in a condition of strain. Thus, no electrostatic charges are present on the surfaces of the sheet 2 and the strain gradient of the sheet 2 corresponds to the strain gradient of that portion of the plate 6 contacted by the sensor 1. This means that once the stress on the plate 6 is relaxed, the plate 6 and the sensor 1 will return to their normal configuration, and an accumulation of electrostatic charges on the surfaces of the sheet 2 will result due to such return. An electrostatic latent image of the strain profile of the plate 6 opposite in polarity to the previous image will thus be formed on the uncoated surface of the sheet 2. Subsequently, such latent image may be developed as previously discussed above to provide a permanent image that may be transferred to plain paper. The sheet 2 may then be neutralized once again and be reused.

Thus, the present invention provides a reusable strain sensor that is relatively simplistic in construction and operation, but yet provides a rapid means for profiling the strain gradient of various types of objects. The sensor 1 is not limited to use with objects having only regular surfaces, but to the contrary may be used on a wide variety of irregular surfaces. However, to obtain accurate and precise strain profiles of objects having irregular surfaces, the piezoelectric sheet 2 should be formed to substantially compensate for piezoelectrically produced electrostatic charges that result when the sensor 1 is not yet attached to or is removed from the object. The effect of such piezoelectrically produced charges can be significantly reduced by forming the piezoelectric strain sensing medium of the sensor 1 with a relatively stiff midsection so that when the sensing medium is not attached to an object and is subjected to a bending force it will bend about such midsection. Such bending action is in accordance with the general principle that bending of a laminate with a relatively stiff middle layer and two equally compliant outer layers will occur about the midsection of the stiffest member of the laminate.

Referring now to FIG. 4, a laminated, piezoelectric layer 9 can readily be constructed to provide such bending action by bonding two of the piezoelectric sheets 2 together in surface-to-surface fashion with a bonding layer 10 which, for example, may be an epoxy glue or the like. The bonding layer 10 serves as a relatively stiff midsection about which the two sheets 2 will bend when the layer 9 is subjected to bending stress. As indicated in FIG. 5, such bending produces compression of the top sheet 2 and extension of the bottom sheet 2 but the dimensions of the center plane of the midsection 10 remain substantially unchanged. As further indicated by the arrows 11 and 12 in the top and bottom sheets 2 respectively, the piezoelectric sheets 2 are poled in the same direction. Thus, compression of the top sheet 2 produces positive and negative charges respectively on the upper and lower surfaces of the top sheet 2, and extension of the lower sheet 2 produces negative and positive charges respectively on the upper and lower surfaces of the bottom sheet 2. The positive charges on the upper surface of the top sheet 2 are approximately equal in magnitude to the positive charges on the lower surface of the lower sheet 2. Accordingly, there is substantially no potential difference between the upper and lower surfaces of the layer 9, which means that the piezoelectrically produced charges that are generated by dimensionally changing or deforming the sensor 1 when it is not attached to an object will have no significant affect on the imaging of the strain gradient when the object is strained. As a result, substitution of the piezoelectric layer 10 for the single piezoelectric sheet 2 of the sensor 1 furnishes a sensor that provides highly accurate profiles of the strain gradients of even irregular objects.

What is claimed is:

1. A strain sensor for placement in surface-to-surface contact with an object for providing a detection of the strain gradient that is produced when a stress is placed on the object, which apparatus comprises:
   a compliant piezoelectric strain sensing element having no conductive layers and comprising
   two nonconductive strain sensitive poled piezoelectric polymeric sheets; and
   a nonconductive separating layer between said piezoelectric sheets, said separating layer being less compliant than said piezoelectric sheets to provide a relatively stiff midsection in said element and about which the piezoelectric sheets will bend when the sensor is not attached to said object; and a compliant electrically conductive layer carried
on not more than one planar surface of said strain sensing element and in surface-to-surface contact with at least a portion of said object in order that said nonconductive piezoelectric strain sensing element will conform to the surface configuration of said portion of said object and produce an electrostatic latent charge pattern on its surfaces which varies in accordance with the change in the strain profile of said portion.

2. A strain sensor as recited in claim 1 wherein said piezoelectric sheets of said strain sensing element are poled in the same direction.

3. A strain sensor as recited in claim 2 wherein one of said piezoelectric sheets of said strain sensing element is in surface-to-surface contact with said conductive layer; and
   said separating layer of said strain sensing element is in surface-to-surface contact with said piezoelectric sheets.

4. A strain sensor as recited in claim 2 wherein said object is substantially less compliant than said sensor such that when the object is subjected to a stress, the sensor will not effect the amount of strain produced in said object.